United States Patent [19]

MacDonald

[11] Patent Number: 5,742,613

[45] Date of Patent: *Apr. 21, 1998

[54] MEMORY ARRAY OF INTEGRATED CIRCUITS CAPABLE OF REPLACING FAULTY CELLS WITH A SPARE

[75] Inventor: Neal Hugh MacDonald, Durham, England

[73] Assignee: Syntaq Limited, England

[*] Notice: The term of this patent shall not extend beyond the expiration date of Pat. No. 5,406,565.

[21] Appl. No.: 50,155

[22] PCT Filed: Nov. 4, 1991

[86] PCT No.: PCT/GB91/01929

§ 371 Date: Apr. 27, 1993

§ 102(e) Date: Apr. 27, 1993

[87] PCT Pub. No.: WO92/08193

PCT Pub. Date: May 14, 1992

[30] Foreign Application Priority Data

Nov. 2, 1990 [GB] United Kingdom ............ 9023867

[51] Int. Cl.$^6$ ............................................. G06F 11/20
[52] U.S. Cl. ........................................... 371/10.3
[58] Field of Search ........................ 371/10.3, 10.1; 365/200, 203, 230; 364/900, 245.3, 255.7, 955.5, 970.1; 324/73.1

[56] References Cited

U.S. PATENT DOCUMENTS

| | | | |
|---|---|---|---|
| 3,735,368 | 5/1973 | Beasoliel | 340/173 R |
| 4,527,251 | 7/1985 | Nibby, Jr. et al. | 364/900 |
| 4,556,975 | 12/1985 | Smith et al. | 371/10 |
| 4,584,681 | 4/1986 | Singh et al. | 371/10 |
| 4,635,190 | 1/1987 | Meyer et al. | 365/200 |
| 4,751,656 | 6/1988 | Conti et al. | 364/488 |
| 4,849,938 | 7/1989 | Furutani et al. | 371/10 |
| 4,860,260 | 8/1989 | Saito et al. | 365/201 |
| 5,022,006 | 6/1991 | Fifield et al. | 365/200 |
| 5,163,023 | 11/1992 | Ferris et al. | 365/200 |
| 5,265,055 | 11/1993 | Horiguchi et al. | 365/200 |
| 5,406,565 | 4/1995 | MacDonald | 371/10.3 |
| 5,504,713 | 4/1996 | Ooishi et al. | 365/200 |
| 5,617,365 | 4/1997 | Horiguchi et al. | 365/200 |

OTHER PUBLICATIONS

Huang et al., "New Approaches for the Repairs of Memories with Redundancy by Row/Column Deletion for Yield Enhancement" IEEE Trans. on Computer–Aided Design of ICs & Sys. vol. 9, No. 3, pp. 323–328, Mar. 1990.

Chang et al., "Diagnosis and Repair of Memory with Coupling Faults" IEEE Trans. on Computers, vol. 38, No. 4, pp. 493–500, Apr. 1989.

Hasan et al., "Minimum Fault Coverage in Reconfigurable Arrays" IEEE Conference 18th Intl. Symposium on Fault–Tolerant Computing, pp. 348–353, Jun. 1988.

*Primary Examiner*—Robert W Beausoliel, Jr.
*Assistant Examiner*—Stephen C. Elmore
*Attorney, Agent, or Firm*—David P. Gordon

[57] ABSTRACT

A fault tolerant random access data storage system comprises a plurality of rows of memory chips 31 plus a first spare row of chips 32 and a second spare row of chips 33, each chip comprising an array of memory locations. A controller 25 addresses the chips with the logical addresses of the rows within the arrays being skewed relative to their physical addresses but in a different manner for the different rows of chips, and with the logical addresses of the columns within the arrays being skewed relative to their physical addresses but in a different manner for the different manner for the different rows of chips. The locations of faults within the chips are recorded so that if a selected array row in a selected chip row 31 is faulty, then a replacement row in the first spare row of chips 32 is selected instead, and if a selected array column in a selected chip row 31 is faulty, then a replacement column in the second spare row of chips 33 is selected instead.

11 Claims, 8 Drawing Sheets

PRIOR ART

Figure 2
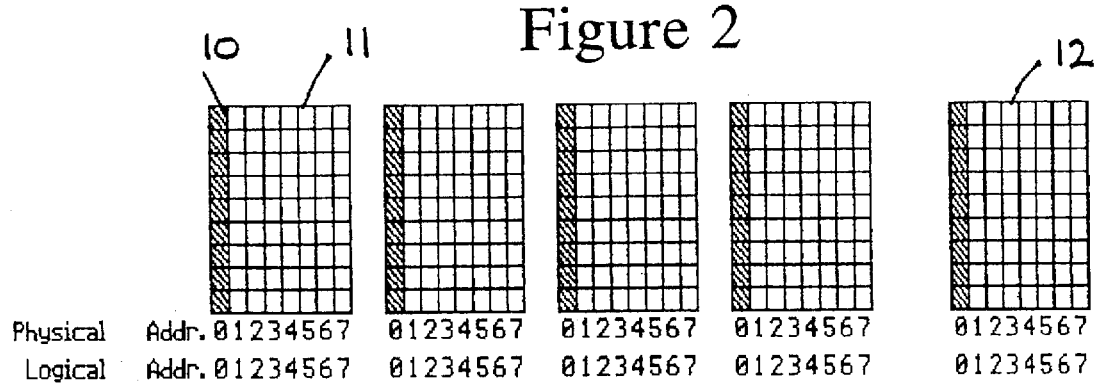
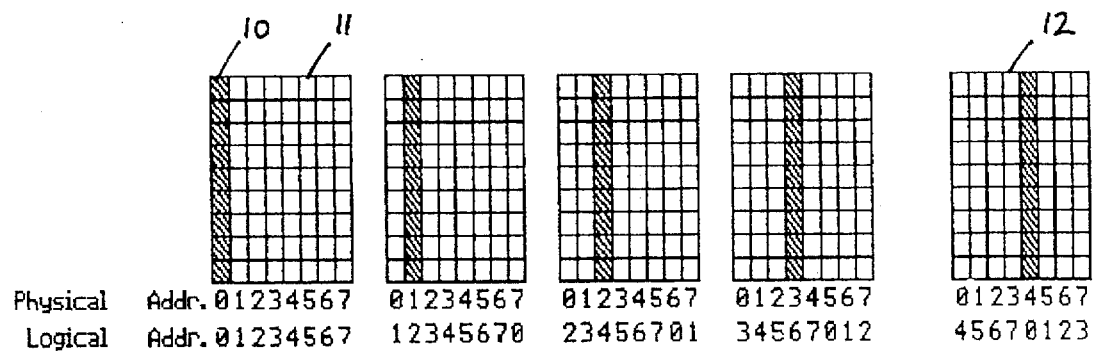
Figure 3

MEMORY ARRAY OF INTEGRATED CIRCUITS CAPABLE OF REPLACING FAULTY CELLS WITH A SPARE

BACKGROUND OF THE INVENTION

This invention relates to a random access data storage system which comprises a plurality of elements, typically integrated circuits or semiconductor chips, each such element comprising an array of memory locations some of which may be faulty.

All memory chips suffer from defects or faults caused by their manufacturing process. Most of these faults are benign in that they do not impair the majority of the memory locations on the chip. Techniques have been developed that repair the defective locations by providing spare locations on the same chip, making the chip appear perfect. Such a chip is called a perfect chip, whereas a chip that contains a small number of faults, but otherwise operates with the same electrical or reliability characteristics as a perfect chip, is called a majority memory chip. Various techniques for tolerating faults within chips are discussed in the prior art introduction of our copending PCT patent application PCT/GB90/01051.

The majority memory chip can take many forms, typically Dynamic Random Access Memory (DRAM), Static Random Access Memory (SRAM), and Programmable Read Only Memory (PROM). Despite some of their names these are all random access memories (RAMs). Such memory chips are arranged as X bits wide by Y address locations deep. A majority RAM contains some X bits that cannot be read from or written to at some Y addresses.

Our copending PCT patent application PCT/GB90/01051 describes two typical embodiments of a fault tolerant data storage system that can retrieve data in either blocks of multiple bits or single bits. The two embodiments are applicable to any size or shape of array of memory chips. Furthermore any type of majority RAM can be used in the array. However the two embodiments are at their most optimum with a wide array of chips where each majority RAM is defined as a 1 bit by Y address memory. For example an array of 64 chips organised as 4 rows of 16 chips each would require 21 spare chips as envisaged in the second embodiment of PCT/GB90/01051. Using that architecture for an array of 32 rows of 2 chips each would require 35 spare chips.

SUMMARY OF THE INVENTION

In accordance with this invention there is provided a fault tolerant random access data storage system which comprises a plurality of main elements, each element comprising an array of memory locations, a first spare element and a second spare element, each spare element comprising an array of memory locations, means for addressing the elements with the logical addresses of the rows within the arrays being skewed relative to their physical addresses but in a different manner for the different elements, and with the logical addresses of the columns within the arrays being skewed relative to their physical addresses but in a different manner for the different elements, and means for recording faulty memory locations so that if a selected row in a selected main element includes a fault, then a replacement row in the first spare element is selected instead, and if a selected column in a selected main element includes a fault, then a replacement column in the second spare element is selected instead.

The main and spare memory elements may comprise individual integrated circuits (or chips), or some or all of the elements may be combined on a single chip.

In an embodiment of the present invention to be described herein, each of the memory elements comprises a row of two chips, each chip being typically 4 or 8 bits wide and Y addresses deep. With each row consisting of two chips, the overhead (in terms of spare chips) comprises only four spare chips. Also, in contrast to the system of PCT/GB90/01051 which requires additional chips for each new row added to the array of chips, the present invention requires a fixed number of spare chips independent of the number of chips in the array.

Even for the two embodiments of PCT/GB90/01051 there is a significant cost saving over arrays constructed from perfect chips since majority RAMs are available at a significant discount. However it is always desirable to keep the component count low to maximise packing density and reliability, and to minimise power dissipation. Accordingly the present invention will achieve higher packing density and reliability and lower power dissipation than the embodiments of PCT/GB90/010151 owing to the greatly reduced numbers of spare chips. Systems of the present invention will also demonstrate shorter access times than the systems of PCT/GB90/01051.

In this invention column faults and row faults can be tolerated by independent, though similar, means. A typical embodiment of the present invention uses an array, comprising many rows of chips, where each row is 2 chips wide (typically each chip is defined as 8 bits wide by Y addresses deep and where Y is split into chip row address (CRA) and chip column addresses (CCA). Four additional, or spare, chips are required. Each of these spare chips can be a majority RAM. Two chips, known as the spare column chips (SC), provide spares for chips containing faulty CCAs and two chips, known as the spare row chips (SR), provide spares for chips containing faulty CRAs. A spare column chip with a faulty CRA is provided with spares in the spare row chip whilst a spare row chip with a faulty CCA is supplied with spares in the spare column chip.

If a faulty CCA is addressed, a non-volatile look-up table, or map, (such as a Programmable Read Only Memory) defining the locations of defects identifies the chip containing the defect and data is read from, or written into, the spare column chips. A faulty CRA is handled in the same way except that data is read from, or written to, the spare row chips. Both SC and SR can contain both faulty CCAs and CRAs by virtue of the technique described in PCT/GB90/01051 which is used to avoid the situation when two or more chips from different array rows exhibit a fault at the same chip address (known as a coincidental fault).

The embodiment described herein uses two maps to determine if a particular CCA or CRA is faulty. These maps are programmed either in the factory prior to shipping the storage system or as a consequence of operational failure. In either case the location of faults has been detected by appropriate tests or diagnostics. These faults are classified as CCA or CRA locations. A computer program executes an algorithm to determine if there are shy coincidental faults within the CCA or CRA data. In the event that coincidental faults appear then the map data is prepared so as to avoid these coincidences and information is created to skew the addressing to each chip. The skew information, or skew values, are used by the control logic of the embodiment described herein and is stored in registers within that control logic.

Said embodiment of the present invention will now be described by way of example only and with reference to the accompanying drawings.

BRIEF DESCRIPTION OF THE DRAWINGS

FIGS. 2 and 3 each show a row of majority memory chips in a memory array in order to explain the principle of skewing physical addresses to avoid coincidental faults between memory chips;

DETAILED DESCRIPTION OF THE PREFERRED EMBODIMENT

Figure 1:
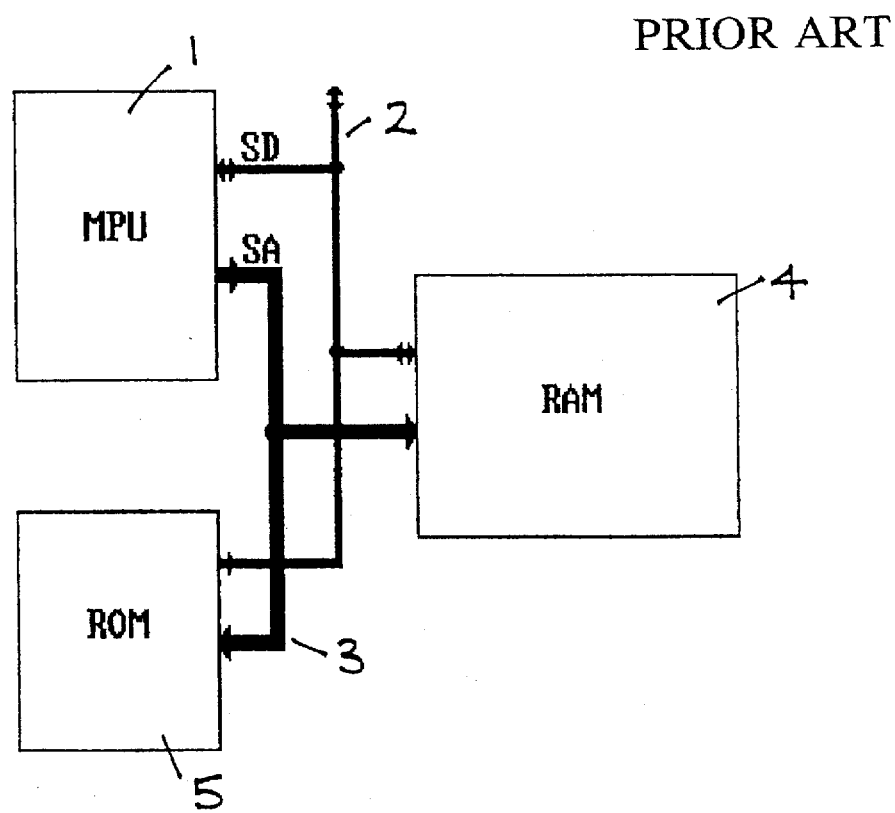
FIG. 1 is a block diagram of a prior art computer system containing a RAM sub-system.

FIG. 1 illustrates a typical computer system in accordance with this invention with a microprocessor (MPU) 1 connected to a read only memory (ROM) 5 and a random access memory (RAM) 4, through a bidirectional system data (SD) bus 2 and a system address (SA) bus 3. In the embodiment of the present invention to be described, the SA bus 3 is split into three effectively separate address busses within the RAM 4. These are for the array row address (ARA), the chip column address (CCA) and the chip row address (CRA). Control signals and peripheral circuits have been omitted from FIG. 1 in the interests of clarity. ARA defines which one of a plurality of rows of chips in an array is to be accessed. CCA defines the column location to be addressed in the chips selected by ARA. CRA defines the row location to be addressed within the chips selected by ARA.

FIGS. 2 and 3 illustrate the principles of differentially skewing the physical and logical addresses of a group of chips. FIG. 2 shows a single row of four majority memory chips 11, plus a spare chip 12: in this case, each chip contains a fault 10 at the same physical address, which in this case is a chip column address, though the same would apply to a chip row address. The chip columns are addressed in parallel but the chips are enabled one-at-a-time. If physical column 0 is addressed when the first chip is enabled, it is of no use to enable the spare chip to use physical column 0 in the spare chip as a replacement column, because this column in the spare chip is also faulty. Even if physical column 0 in the spare chip was good so that the faulty physical column 0 of the first chip could be replaced by physical column 0 of the spare chip, the faulty column 0 of the second chip (when this chip is addressed) could not be replaced by enabling the spare chip, because physical column 0 of the spare chip is already used as the spare for column 0 of the first chip. By contrast in FIG. 3, the physical addresses are differentially skewed so that a given logical address selects different physical columns in the different chips. The skewing is arranged so that for any given logical address, no more than one chip will have a fault in the columns selected. Thus, when any chip is enabled, and when its faulty column (if any) is addressed, a good column (of corresponding logical address) is found in the spare chip as a replacement, which is not used as a replacement for the faulty columns of any of the other chips. Accordingly the spare column chip 12 can provide a spare or replacement column for each of the faulty chips. In other words, the skewing arrangements provide tolerance for coincidental faults, i.e. faults in the same physical columns of two or more chips. The same principles apply in respect of rows.

Figure 4:
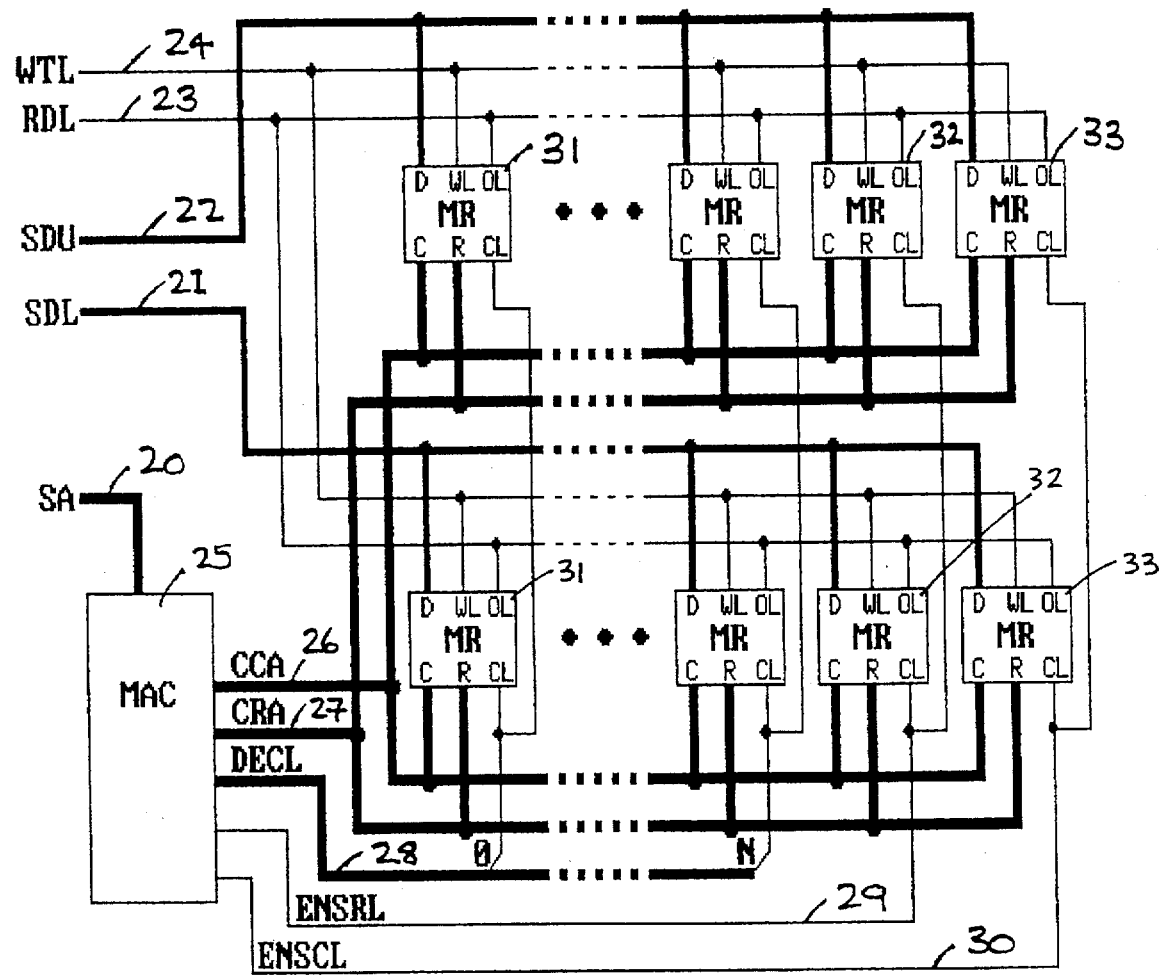
FIG. 4 is a block diagram of an embodiment of fault tolerant data storage system in accordance with this invention.

FIG. 4 is a block diagram of the embodiment of data storage system of the present invention. The RAM array in this example comprises 32 rows, each 2 chips wide. All the chips in the array are majority rams (MR) 31. In the interest of clarity only the first and last rows of the array are shown. The system address (SA) bus 20 provides all address information to the memory address controller (MAC) 25. The MAC 25 drives a separate chip column address (CCA) bus 26 and chip row address (CRA) bus 27. The CCA and CRA are logically skewed within MAC 25 to provide tolerance of coincidental faults. Each array row is separately enabled by thirty two individual decode lines (DECL) 28. DELCO is connected to the chip enable terminals of all chips MR in array row 0, DELC1 to array row 1 and so on. The array has two extra rows of chips MR, the spare row (SR) 32 and spare column (SC) 33. The chip enable terminals of chips SR 32 are connected to Enable Spare Row Line (ENSRL) 29. The chip enable terminals of chips SC 33 are connected to Enable Spare Column Line (ENSCL) 30. Each column of each chip MR is typically 8 bits wide creating a combined two byte parallel data bus comprising System Data Upper bus (SDU) 22 and System Data Lower (SDL) 21.

Individual byte pairs (known as a word) are enabled by selecting one array row from thirty two array rows by the assertions of one of the DECL lines. Asserting one of the two direction control lines, the Read (RDL) line 23 or the Write (WTL) line 24 will allow a selected word to be read or written respectively over the SDL and SDU data lines.

Figure 5:
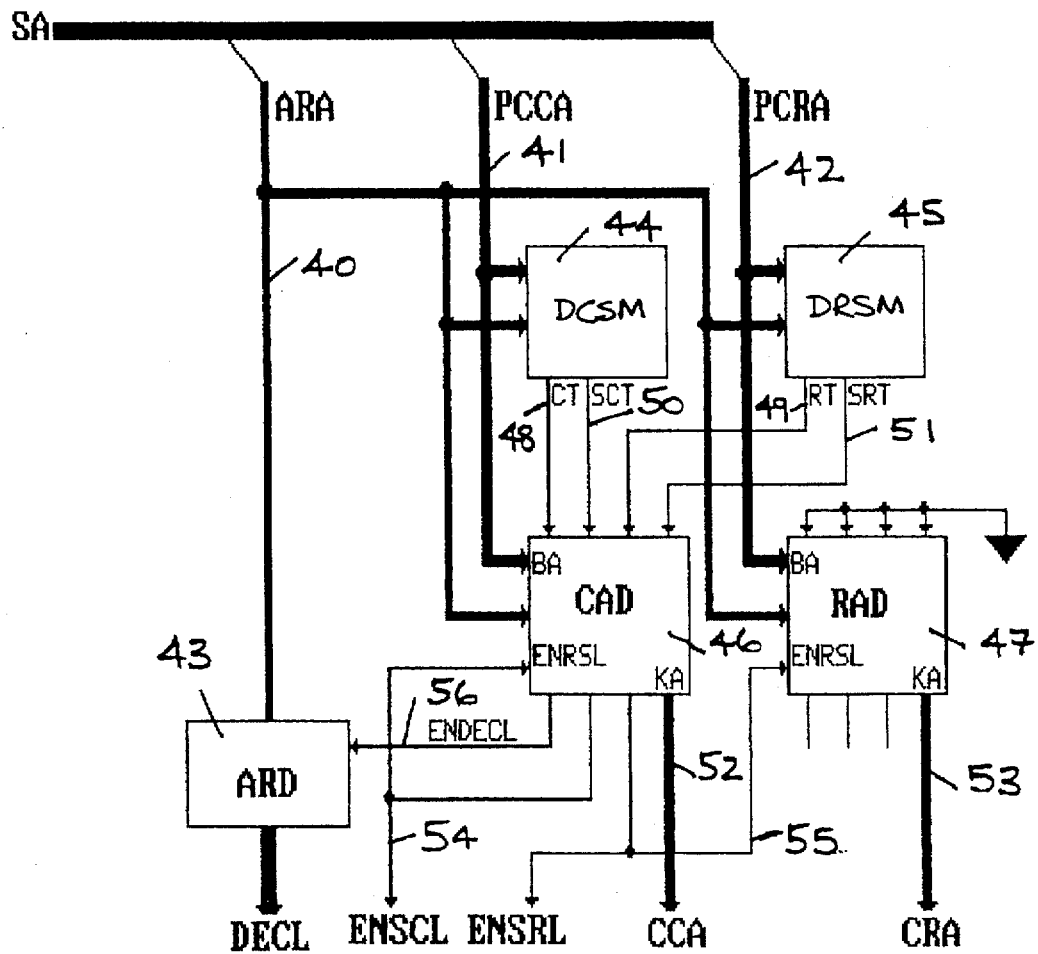
FIG. 5 is a block diagram of a memory array controller (MAC) of the fault tolerant data storage system in accordance with this invention.

FIG. 5 illustrates the MAC 25. The SA bus 20 is split into three buses, ARA 40, Logical Chip Column Address (PCCA) 41, and Logical Chip Row Address (PCRA) 42. The ARA bus controls the array row decoder (ARD) 43 producing thirty two unique DECL lines. The ARA bus is also connected to the DCSM 44, DRSM 45, column address driver (CAD) 46 and row address driver (RAD) 47. CAD 46 produces the skewed chip column address for the memory array on bus CCA 52. RAD 46 produces the skewed chip row address for the memory array on bus CRA 53.

Figure 6:
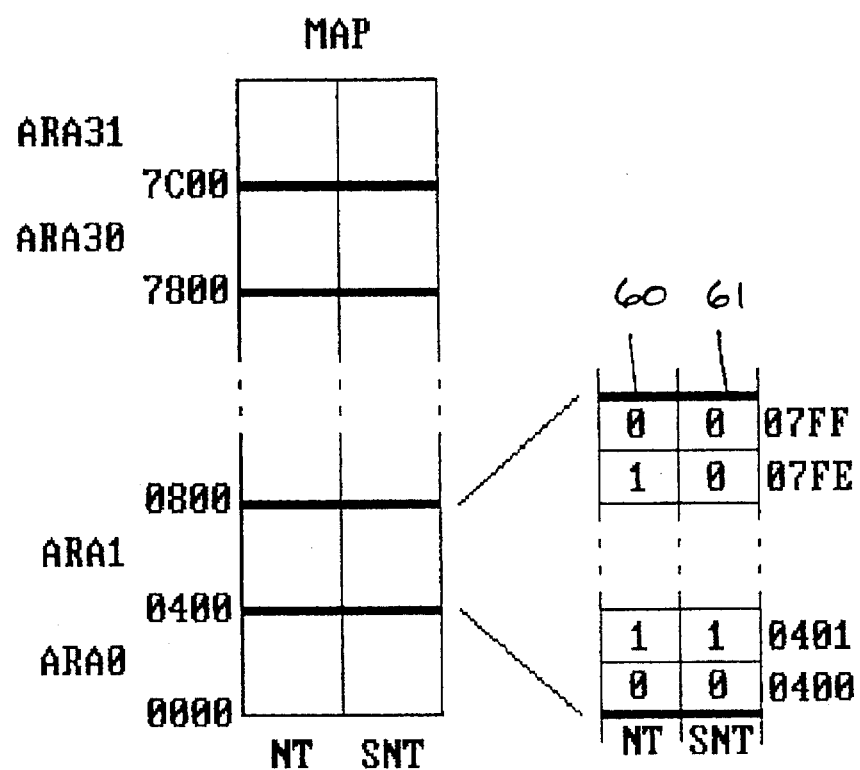
FIG. 6 shows a typical format for a dynamic column sparing map (DCSM) or dynamic row sparing map (DRSM) of the system in accordance with this invention.

Each address driver 46 or 47 receives a tag bit, Column Tag (CT) 48 or Row Tag (RT) 49, from their respective DCSM 44 or DRSM 45. These tag bits indicate if a CCA or CRA is faulty. A typical format for DCSM is shown in FIG. 6. ARA selects a range of N locations which tag individual faulty addresses in MR. For example if each MR consists of 1M addresses then CCA and CRA contain 10 lines each. Accordingly a map PROM consists of 32×1K locations. Each map location comprises two bits, the Tag bit 60 and a Spare Tag bit 61. The tag bits from DCSM and DRSM combine to create the following truth table:

TABLE 1

| CT | RT | SCT | SRT | Enable | Note |
|----|----|----|-----|--------|------|
| 0 | 0 | X | X | DECLn | One of 32 array rows |
| 1 | 0 | 0 | X | SC | CCA fault only select SC |
| 1 | 0 | 1 | X | SR | CRA fault in SC, select SR |
| 0 | 1 | X | 0 | SR | CRA fault only select SR |

TABLE 1-continued

| CT | RT | SCT | SRT | Enable | Note |
|----|----|-----|-----|--------|------|
| 0 | 1 | X | 1 | SC | CCA fault in SR, select SC |
| 1 | 1 | 0 | X | SC | CCA/CRA fault, select SC |
| 1 | 1 | 1 | X | SR | CRA fault in SC, select SR |

FIG. 5 shows the additional tag bits to identify address faults within the SR and SC. These are known as SRT 50 and SCT 51. One of three enable signals are asserted as a consequence of executing the truth table of Table 1 and are defined as follows; ENSCL 54 enables SC, ENSRL 55 enables SR and ENDECL 56 enables the ARD 43 if both ENSCL and ENSRL are negated (in which case the appropriate DECL line is asserted by the ARD 43).

Figure 7:
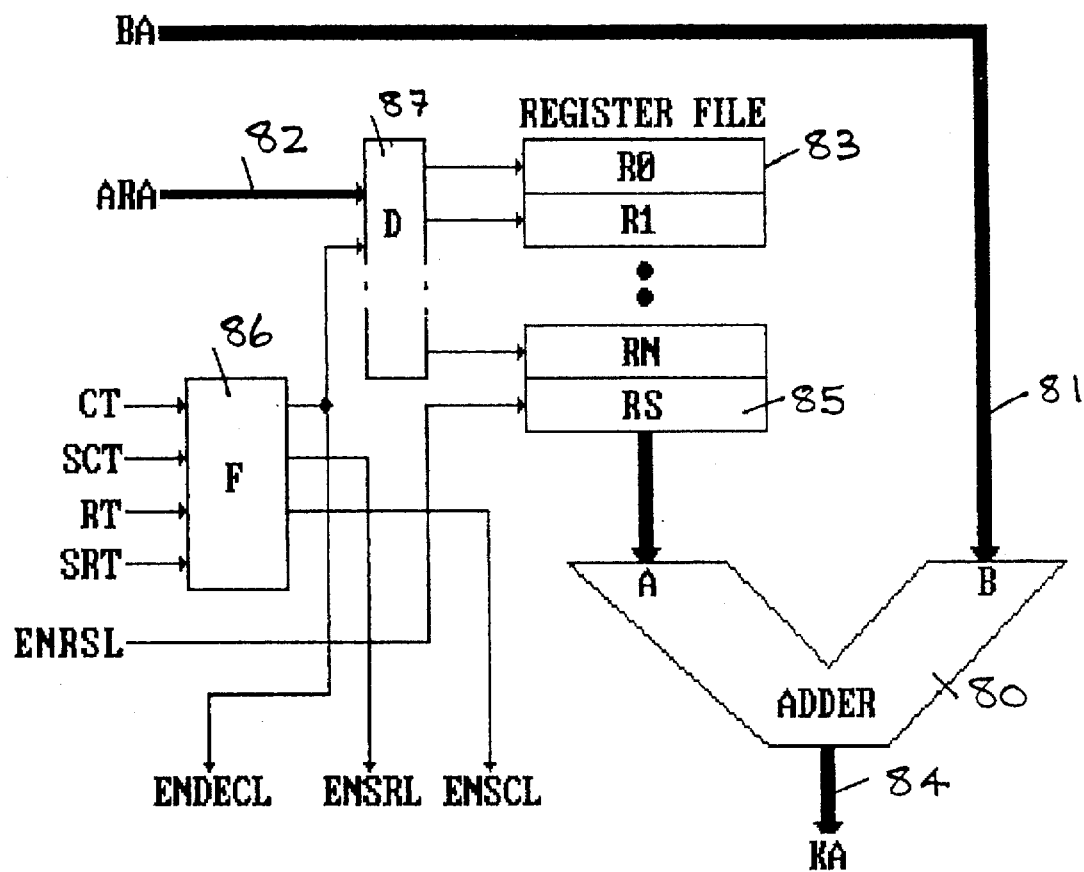
FIG. 7 is a block diagram of an address driver (AD) circuit of the memory array controller in accordance with this invention.

FIG. 7 shows the internal circuit of an Address Driver. The same circuit can be used as a CAD or RAD. The skewing mechanism employs a full ADDER 80 to produce the sum of the logical or base address (BA) 81 and the contents of one of thirty two registers from a Register File 83. A specific register for each chip row is selected by the ARA bus 82 via a decoder (D) 87. The skewed address is the output of the adder, KA 84. The registers are non-volatile registers (programmed at the same as DCSM and DSRM) or they are programmed every time the system is powered up. The write path for the Register File 83 is omitted in the interests of clarity however many examples of Register File circuits are known to those skilled in the art. In the case of volatile registers a skew value table is contained in the DCSM and DRSM. Typical map PROMs are 8 bits wide where two bits are used for tagging, leaving typically five bits for each half of thirty three 10 bit skew values. The skew values are typically packed in five bit entities (the upper and lower half of each ten bit value) into an appropriate area of a map. These values can be unpacked by reading the map PROMs.

After programming, each of the registers contain a skew value determined by an appropriate algorithm to avoid all coincidental faults over a range of 32 array rows. Many algorithms can be developed for generating skew values. All routines start with a map of faults for each MR in the array. These maps have been generated by testing individual MRs with appropriate test hardware and stimulation. The simplest routines simply add a number to the first location of any fault and then re-examine the chip maps to see if the coincident fault has been avoided. If a coincidence still remains the same location is incremented again and the fault maps tested again, and so on until the incremented value exceeds the number of locations possible.

FIG. 7 shows an additional register (RS) 85 used to store the skew value for SR or SC depending on the designation of the Address Driver. The SR or SC is selected by ENSCL or ENSRL respectively. Accordingly subject to the conditions defined by Table 1 then one of thirty three registers is selected to provide the A input to the ADDER, thus all coincidental CCA and CRA faults can be tolerated. The truth table of Table 1 is executed by the function (F) block 86. Both CAD and RAD can be implemented from the same circuit and only one Address Driver has valid terms to the function block as shown in FIG. 5.

The access time of the embodiment is composed of the access time of the MR in the array and the access time of a map PROM. This is so since the chip enable terminals of the MRs are asserted after the CAD resolves which one of thirty four chip enables to select (32 DECL lines plus ENSRL and ENSCL). It would be beneficial to use the cheapest form of PROM for the maps and this implies the slowest form of PROM. However this will increase the access time of the storage system. However if two further ARDs are used in the system then individual array rows can be preselected. The original ARD asserts one of thirty two (DECL) lines which select the individual chip enable lines of each row of the array as before. This ARD is known as the Chip Enable ARD (CARD). The second ARD known as the Output Enable ARD (OARD) asserts one of thirty two (ODECL) lines which select individual output enable lines of all MRs in an array row (instead of a common connection to RDL as above). The third ARD known as the Write Enable ARD (WARD) asserts one of thirty two (WDECL) lines which select individual write enable lines of all MRS in an array row (instead of a common connection WTL as above). All ARD outputs are selected by the ARA bus. In the case of OARD the decoder is enabled by RDL, in the case of WARD the decoder is enabled by WTL. In the case of the spare rows, SR and SC the output enable lines (ENOSRL and ENOSCL) and write enable lines (ENWSRL and ENSWCL) are gated with RTL and WTL respectively.

The additional output enable and write enable signals allow three array rows to be enabled simultaneously, that is one DECL signal, ENSRL and ENSCL are all asserted together. No output enable or write enable signal is asserted until the function unit in the MAC has resolved if there is to be any sparing and if so which of SR or SC is to be asserted. At this time only one of thirty two DECL lines (from CARD) or ENSRL or ENSCL is asserted. Then depending upon the type of operation being performed (read or write) one of thirty two ODECL or ENOSRL or ENOSCL, or one of thirty two WDECL or ENWSRL or ENWSCL is asserted substantially later than chip enable. Accordingly the access time of the map can be hidden in the delay between chip enable and output enable (or write enable) assertion.

Figure 8:
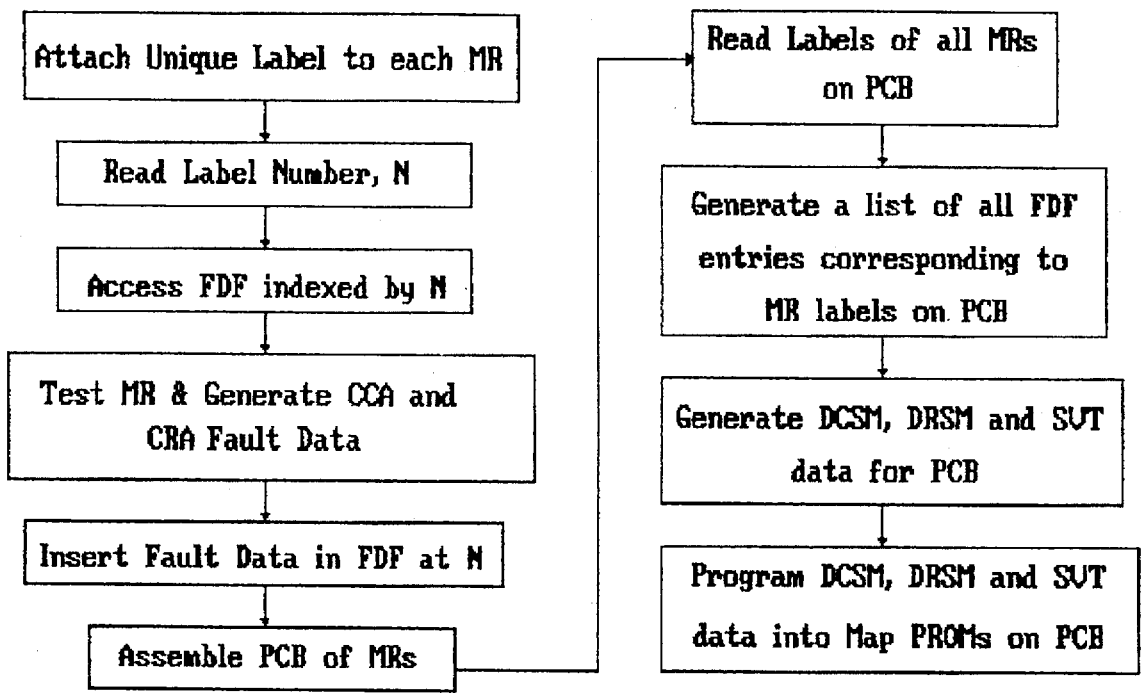
FIG. 8 is a flow diagram to illustrate a manufacturing process used to determine the contents of the dynamic sparing maps.
Figure 9:
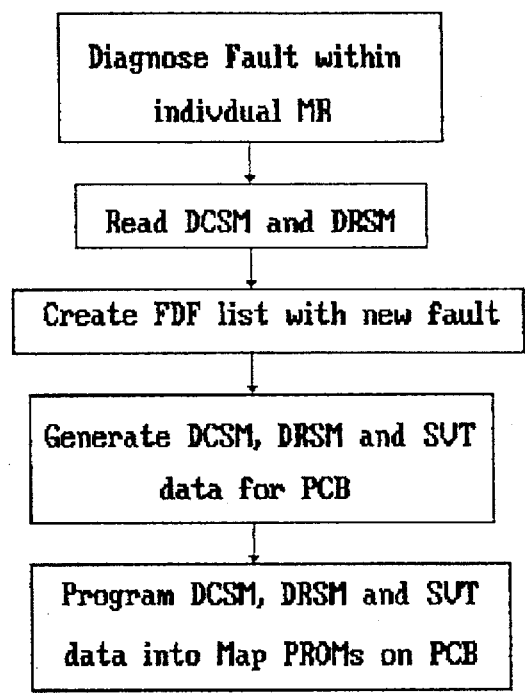
FIG. 9 is a flow diagram to illustrate a process to respond to operational failure within any majority memory chip within the system.

FIGS. 8 and 9 illustrate two typical processes used to define the contents of the map PROMS, DCSM and DSRM. FIG. 8 shows a typical process to manage faults arising from MR manufacture in the factory. Computer readable labels are attached to each MR. Each label would be written with a unique code typically in bar-code format or optical character recognition (OCR) format. Unique codes could simply comprise sequential numbers. Such a label gives each MR a unique identity which is used to create an entry within a Fault Data File (FDF). The MR is tested using appropriate equipment and electrical and environmental conditions. If faults are detected within the MR as a consequence of this testing, then such faults are diagnosed as CCA and/or CRA faults and stored in the FDF within the space indexed by the MR identification number N. MRs can be re-tested many times and CCA and/or CRA data appended to the entry for that chip within FDF.

MRs are then released to an assembly process and are attached at random to suitable substrates such as a printed circuit board (PCB). After assembly is complete, all MR identities on the PCB are read. A list of identity numbers is created, cross-referencing numerous values of N with the position of MRs on the PCB. This cross-referenced list is used to access the FDF to create a sub-set of the FDF for all MRs on a particular PCB. The anti-coincidence computer program is then executed using the FDF subset as its input data. The program generates the appropriate output data in a form similar to that shown in FIG. 6. This output data is used to program DCSM, DRSM and to pack the skew value table into these maps.

FIG. 9 shows the process for in-situ testing of MRs. This is similar to the process shown in FIG. 8 except DCSM and/or DRSM are reprogrammed with appropriate data as a consequence of an operational failure of a chip MR. The input data for the anti-coincidence program is read back from the DSCM and/or DRSM before they are erased prior to programming. This data is appended with data describing the operational failure and then input to the anti-coincidence program. As in FIG. 8 the output of the program is used to program DCSM and DRSM.

I claim:

1. A fault tolerant random access data storage system, comprising:
   a) a plurality of main memory elements, each said main memory element having an array of memory locations arranged in rows and columns with respective physical addresses;
   b) a first spare memory element and a second spare memory element, each said spare memory element having an array of memory locations arranged in rows and columns with respective physical addresses;
   c) random said main and first spare memory elements having random rows which are faulty and random said main and second spare memory elements having random columns which are faulty;
   d) a plurality of data lines connected to respective said main memory elements for writing data to or reading data from said main memory elements in parallel;
   e) means for generating logical row addresses one-at-a-time and for generating logical column addresses one-at-a-time;
   f) programmable electronic means for converting each said logical row address into a set of physical row addresses, one for each main memory element and one for said first spare memory element, with the physical row addresses of each said set being skewed relative to each other and relative to the respective logical row address such that, for each logical row address which is generated, no two memory elements of said main and first spare memory elements have faulty rows at the respective converted physical row addresses;
   g) said programmable electronic means being also for converting each said logical column address into a set of physical column addresses, one for each main memory element and one for said second spare memory element, with the physical column addresses of each said set of physical column addresses being skewed relative to each other and relative to the respective logical column address such that, for each logical column address which is generated, no two memory elements of said main and second spare memory elements have faulty columns at the respective converted physical column addresses; and
   h) means for recording the locations of faulty rows in said main and first spare memory elements and the locations of faulty columns in said main and second spare memory elements such that if, in response to any said logical row address, a selected row in one of said main memory elements is faulty, then a replacement row in said first spare element is selected instead and connected to the data line of said one of said main memory elements in which said selected row is faulty, and if, in response to any said logical column address, a selected column in one of said main memory elements is faulty, then a replacement column in said second spare element is selected instead and connected to the data line of said one of said main memory elements in which said selected column is faulty.

2. A fault tolerant random access data storage system as claimed in claim 1, arranged so that if a selected replacement row in said first spare element includes a column fault, then a replacement column in said second spare element is selected instead.

3. A fault tolerant random access data storage system as claimed in claim 2, arranged so that if a selected replacement column in the second spare element includes a row fault, then a replacement row in the first spare element is selected instead.

4. A fault tolerant random access data storage system as claimed in claim 3, comprising a first look-up table recording faulty column locations, and a second look-up table recording faulty row locations.

5. A fault tolerant random access data storage system as claimed in claim 2, comprising a first look-up table recording faulty column locations, and a second look-up table recording faulty row locations.

6. A fault tolerant random access data storage system as claimed in claim 1, arranged so that if a selected replacement column in said second spare element includes a row fault, then a replacement row in said first spare element is selected instead.

7. A fault tolerant random access data storage system as claimed in claim 6, comprising a first look-up table recording faulty column locations, and a second look-up table recording faulty row locations.

8. A fault tolerant random access data storage system as claimed in claim 1, comprising a first look-up table recording faulty column locations, and a second look-up table recording faulty row locations.

9. A method of forming a fault tolerant random access data storage system as claimed in claim 1, comprising testing a plurality of memory elements to determine and record fault location data relating to locations of any faults in said memory elements, processing said fault location data together with data representing positions of each of the said memory elements in an array, to generate addressing skew value data, and programming said addressing skew value data into look-up tables of said random access data storage system.

10. A method as claimed in claim 9, in which said memory elements are tested before assembly into an array.

11. A method as claimed in claim 9, in which said memory elements are tested or retested after assembly into an array.

* * * * *